US010636816B2

United States Patent
Gao et al.

(10) Patent No.: US 10,636,816 B2
(45) Date of Patent: Apr. 28, 2020

(54) THIN FILM TRANSISTOR AND MANUFACTURING METHOD THEREOF, ARRAY SUBSTRATE AND DISPLAY PANEL

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jilei Gao, Beijing (CN); Xuebing Jiang, Beijing (CN); Songmei Sun, Beijing (CN); Peng Wu, Beijing (CN); Jian Zhao, Beijing (CN); Yang Zhang, Beijing (CN); Mo Chen, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 106 days.

(21) Appl. No.: 15/766,570

(22) PCT Filed: Sep. 28, 2017

(86) PCT No.: PCT/CN2017/103911
§ 371 (c)(1),
(2) Date: Apr. 6, 2018

(87) PCT Pub. No.: WO2018/149142
PCT Pub. Date: Aug. 23, 2018

(65) Prior Publication Data
US 2019/0074302 A1 Mar. 7, 2019

(30) Foreign Application Priority Data

Feb. 17, 2017 (CN) .......................... 2017 1 0086370

(51) Int. Cl.
*H01L 27/12* (2006.01)
*H01L 29/786* (2006.01)
(Continued)

(52) U.S. Cl.
CPC ...... *H01L 27/1214* (2013.01); *H01L 27/0203* (2013.01); *H01L 27/1225* (2013.01);
(Continued)

(58) Field of Classification Search
CPC ................................................. H01L 29/78633
See application file for complete search history.

(56) References Cited

U.S. PATENT DOCUMENTS

2012/0168756 A1* 7/2012 Ryu .................. H01L 29/41733
257/59
2015/0179687 A1 6/2015 Lee et al.
(Continued)

FOREIGN PATENT DOCUMENTS

| CN | 103487982 A | 1/2014 |
| CN | 103943630 A | 7/2014 |

(Continued)

OTHER PUBLICATIONS

International Search Report and Written Opinion dated Dec. 28, 2017; PCT/CN2017/103911.
(Continued)

*Primary Examiner* — Raj R Gupta

(57) ABSTRACT

A thin film transistor, a manufacturing method thereof, an array substrate and a display panel are provided. The thin film transistor includes: a base substrate; and a gate electrode, a gate insulating layer, an active layer and a source/drain electrode layer which are on the base substrate. The source/drain electrode layer includes a source electrode and a drain electrode. The thin film transistor further includes a light blocking layer surrounding the active layer.

15 Claims, 5 Drawing Sheets

(51) Int. Cl.
  *H01L 27/02*  (2006.01)
  *H01L 29/66*  (2006.01)

(52) U.S. Cl.
  CPC .... *H01L 29/66227* (2013.01); *H01L 29/7869* (2013.01); *H01L 29/78606* (2013.01); *H01L 29/78633* (2013.01)

(56) References Cited

U.S. PATENT DOCUMENTS

2016/0062199 A1  3/2016  Zhao
2017/0023836 A1* 1/2017  Zeng ................. G02F 1/133516
2018/0081214 A1  3/2018  Yao

FOREIGN PATENT DOCUMENTS

| CN | 104950541 A   | 9/2015  |
| CN | 105575910 A   | 5/2016  |
| CN | 106876386 A   | 6/2017  |
| JP | 2004-327539 A | 11/2004 |

OTHER PUBLICATIONS

The First Chinese Office Action dated Mar. 6, 2019; Appln. No. 201710086370.5.

* cited by examiner

THIN FILM TRANSISTOR AND
MANUFACTURING METHOD THEREOF,
ARRAY SUBSTRATE AND DISPLAY PANEL

This application claims the benefit of Chinese Patent Application No. 201710086370.5 filed on Feb. 17, 2017, which is hereby entirely incorporated by reference as a part of the present application.

TECHNICAL FIELD

At least one embodiment of the present application relates to a thin film transistor and its manufacturing method, an array substrate and a display panel.

BACKGROUND

In general, a thin film transistor is used as a driving element of a display panel. After an active layer in the thin film transistor is irradiated with light, photo-induced carriers are generated, and this results in an increase in a leakage current of the thin film transistor and thereby affects the quality of pictures displayed by the display panel, for example, causing crosstalk, afterimage or other undesirable phenomena.

SUMMARY

At least one embodiment of the present disclosure provides a thin film transistor which includes a base substrate, and a gate electrode, a gate insulating layer, an active layer and a source/drain electrode layer which are on the base substrate, the source/drain electrode layer includes a source electrode and a drain electrode, and the thin film transistor further includes a light blocking layer surrounding the active layer.

For example, in the thin film transistor provided by at least one embodiment of the present disclosure, the light blocking layer and the source/drain electrode layer are in a same layer and include a same material; or the light blocking layer and the active layer are in a same layer and include a same material.

For example, in the thin film transistor provided by at least one embodiment of the present disclosure, the light blocking layer is connected with one of the source electrode and the drain electrode and is spaced apart from the other one of the source electrode and the drain electrode.

For example, in the thin film transistor provided by at least one embodiment of the present disclosure, in a case where the light blocking layer and the active layer are in the same layer, the light blocking layer is spaced apart from the active layer.

For example, in the thin film transistor provided by at least one embodiment of the present disclosure, the light blocking layer includes an insulating material.

For example, in the thin film transistor provided by at least one embodiment of the present disclosure, a distance from a surface, away from the base substrate, of the light blocking layer to the base substrate is greater than or equal to a distance from a surface, away from the base substrate, of the active layer to the base substrate; or a distance from a surface, close to the base substrate, of the light blocking layer to the base substrate is smaller than or equal to a distance from a surface, close to the base substrate, of the active layer to the base substrate; or the distance from the surface, away from the base substrate, of the light blocking layer to the base substrate is greater than or equal to the distance from the surface, away from the base substrate, of the active layer to the base substrate, and the distance from the surface, close to the base substrate, of the light blocking layer to the base substrate is smaller than or equal to the distance from the surface, close to the base substrate, of the active layer to the base substrate.

For example, in the thin film transistor provided by at least one embodiment of the present disclosure, an orthographic projection of the light blocking layer on the base substrate is within an orthographic projection of the gate electrode on the base substrate.

For example, in the thin film transistor provided by at least one embodiment of the present disclosure, an orthographic projection of the light blocking layer on the base substrate is outside of an orthographic projection of the gate electrode on the base substrate.

For example, in the thin film transistor provided by at least one embodiment of the present disclosure, the light blocking layer includes a plurality of subsections which are spaced apart from each other and are configured that the active layer is shielded by the light blocking layer in a direction parallel to the base substrate.

At least one embodiment provides an array substrate, which includes the thin film transistor according to any one of the above embodiments.

For example, the array substrate provided by at least one embodiment of the present disclosure further includes a plurality of gate lines and a plurality of data lines, the plurality of gate lines and the plurality of data lines cross each other to define a plurality of sub-pixel regions, each of the sub-pixel regions includes the thin film transistor and a pixel electrode, the gate electrode of the thin film transistor is electrically connected with the gate line corresponding to the thin film transistor, the source electrode of the thin film transistor is electrically connected with the data line corresponding to the thin film transistor, and the drain electrode of the thin film transistor is electrically connected with the pixel electrode; and each of the sub-pixel regions includes a display region and a non-display region, and the light blocking layer is in the non-display region of each of the sub-pixel regions.

For example, in the array substrate provided by at least one embodiment of the present disclosure, a first end of the light blocking layer is connected with the data line, and a second end of the light blocking layer is spaced apart from the drain electrode.

For example, in the array substrate provided by at least one embodiment of the present disclosure, the light blocking layer surrounds the thin film transistor.

At least one embodiment of the present disclosure provides a display panel, which includes the array substrate according to any one of the above embodiments and an opposite substrate which is opposite to the array substrate.

For example, in the display panel provided by at least one embodiment of the present disclosure, a spacer is between the opposite substrate and the array substrate, the spacer is opposite to the thin film transistor on the array substrate in a direction perpendicular to the array substrate, and the spacer includes a light blocking material.

For example, in the display panel provided by at least one embodiment of the present disclosure, the light blocking material includes carbon black or a black resin, or includes carbon black and a black resin.

At least one embodiment of the present disclosure provides a manufacturing method of a thin film transistor, which includes: providing a base substrate; and forming a gate electrode, a gate insulating layer, an active layer and a source/drain electrode layer on the base substrate, the source/drain electrode layer including a source electrode and a drain electrode; the method further including forming a light blocking layer surrounding the active layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
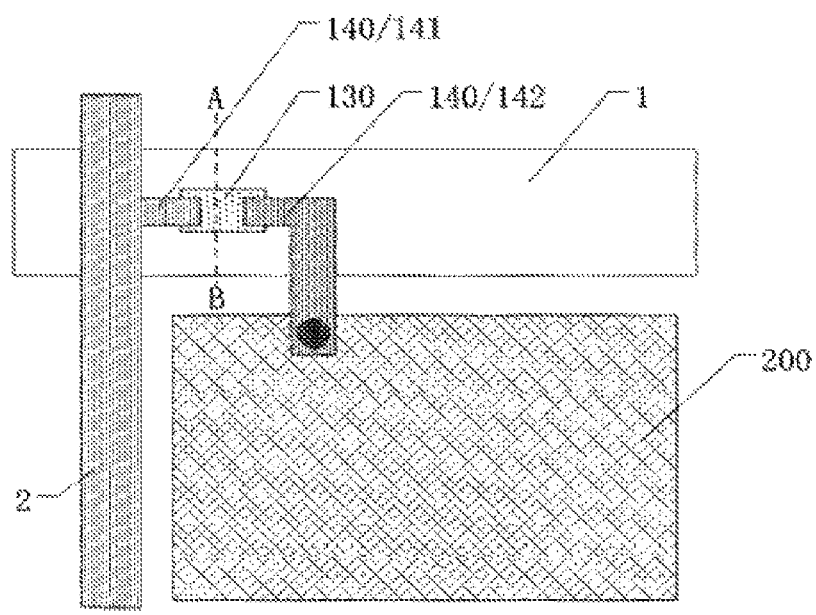
FIG. 1a is a schematic top view of a sub-pixel region of an array substrate.

FIG. 1a is a schematic top view of a sub-pixel region of an array substrate. As shown in FIG. 1a, a gate line 1 and a data line 2 cross each other to define a sub-pixel region. The sub-pixel region includes a thin film transistor and a pixel electrode 200, and the thin film transistor is connected with the pixel electrode 200. After an active layer 130 of the thin film transistor is irradiated by light, a large quantity of photo-induced carriers are generated, and this causes a leakage current of the thin film transistor in an off state to increase, which causes defects such as afterimages and crosstalk in a display device including the array substrate.

Figure 1B:
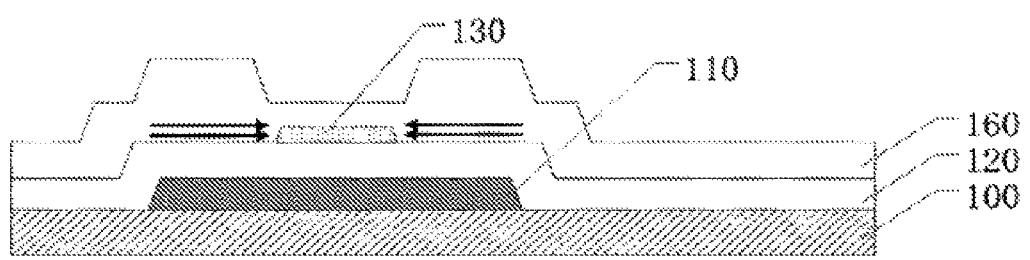
FIG. 1b is a schematic cross-sectional view of a thin film transistor in the sub-pixel region shown in FIG. 1a along an A-B direction.

FIG. 1b is a schematic cross-sectional view of the thin film transistor along an A-B direction in the sub-pixel region shown in FIG. 1a. As shown in FIG. 1b, a gate electrode 110 disposed under the active layer 130 blocks light incident on the active layer 130 from a position below the active layer 130. In addition, for example, a black matrix (not shown) is disposed on the active layer 130 to block light incident on the active layer 130 from a position above the active layer 130. However, as shown in FIG. 1b, a gate insulating layer 120 and a passivation layer 160 are generally made of a transparent material, so a lateral surface of the active layer 130 may be irradiated by light (indicated by arrows in FIG. 1b). Therefore, in the thin film transistor shown in FIG. 1a and FIG. 1b, light irradiating the lateral surface of the active layer 130 is not avoided, and a large amount of photo-induced carriers may generated in the active layer 130.

At least one embodiment of the present disclosure provides a thin film transistor, a manufacturing method thereof, an array substrate and a display panel to at least solve the above defects. The thin film transistor includes a substrate, and a gate electrode, a gate insulating layer, an active layer and a source/drain electrode layer which are on the base substrate, the source/drain electrode layer includes a source electrode and a drain electrode, and the thin film transistor further includes a light blocking layer surrounding the active layer. By providing the light blocking layer, light irradiated on a lateral surface of the active layer is blocked, so that a leakage current caused by photo-induced carriers is effectively reduced.

It should be noted that, in all the embodiments of the present disclosure, each direction is described taking the base substrate of the thin film transistor as a reference. Exemplarily, taking the active layer as an example, an "upper surface" of the active layer is a surface away from the base substrate, a "lower surface" of the active layer is a surface close to the base substrate, and the "lateral surface" of the active layer is a surface sandwiched between the upper surface and the lower surface. In addition, further taking the active layer as an example, an arrangement on a "lateral side" of the active layer involves an arrangement along a direction parallel to a surface of the base substrate, an arrangement "above" or "on" or "below" the active layer involves an arrangement along a direction perpendicular to the surface of the base substrate, "above" or "on" the active layer involves being at a side of the active layer away from the base substrate, and "below" the active layer involves being at a side of the active layer close to the base substrate.

Hereinafter, the thin film transistor, the method for preparing the thin film transistor, the array substrate and the display panel according to embodiments of the present disclosure will be described with reference to the accompanying drawings.

Figure 2A:
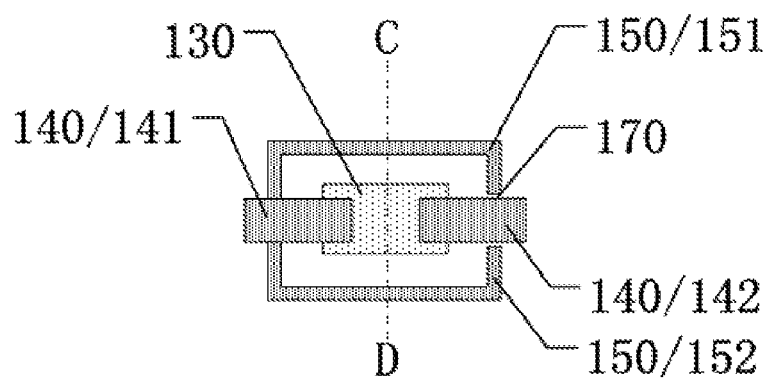
FIG. 2a is a top view of a thin film transistor provided by at least one of embodiments of the present disclosure.

At least one embodiment of the present disclosure provides a thin film transistor, and FIG. 2a is a schematic structural plan view of the thin film transistor provided by at least one embodiment of the present disclosure. For example, as illustrated in FIG. 2A, the thin film transistor includes an active layer 130, a source/drain electrode layer 140 and a light blocking layer 150, the source/drain electrode layer 140 includes a source electrode 141 and a drain electrode 142 which are electrically connected with the active layer 130, and the light blocking layer 150 surrounds the active layer 130 to prevent light from being incident on a lateral surface of the active layer 130.

It should be noted that, in the embodiments of the present disclosure, the thin film transistor further includes a base substrate, a gate electrode, a gate insulating layer and the like; furthermore, the embodiments of the present disclosure do not limit the type of the thin film transistor, for example, the light blocking layer 150 in the above embodiments is applicable for a bottom gate type thin film transistor, a top gate type thin film transistor, a double gate thin film transistor, or the like, as long as the light blocking layer prevents light from being incident on the lateral surface of the active layer 130 of the thin film transistor.

In the following, the technical solution in the embodiments of the present disclosure will be described by taking the thin film transistor being a bottom-gate type thin film transistor as an example.

It should be noted that, providing the light blocking layer 150 to prevent light from being incident on the lateral surface of the active layer 130 includes: the light blocking layer 150 is provided such that a portion of the lateral surface of the active layer 130 is not irradiated by the light; or the light blocking layer 150 is provided such that the whole lateral surface of the active layer 130 is not irradiated by the light. The embodiments of the present disclosure do not limit the range in which the light blocking layer 150 prevents the light from being incident on the lateral surface of the active layer 130, as long as the light blocking layer 150 is disposed to reduce the light irradiated on the active layer 130.

It should be noted that, for example, the light blocking layer 150 prevents the light from being irradiated onto an upper surface and/or a lower surface of the active layer 130, besides preventing the light from being irradiated onto the lateral surface of the active layer 130.

In the embodiments of the present disclosure, the arrangement manners of the light blocking layer 150 are not limited. For example, in some embodiments of the present disclosure, the light blocking layer 150 is individually provided. For example, in some embodiments of the present disclosure, the light blocking layer 150 is simultaneously prepared in the process of manufacturing other components of the thin film transistor. In the following, different arrangement manners of the light blocking layer 150 will be respectively described.

For example, in at least one embodiment of the present disclosure, the light blocking layer 150 is individually provided to surround the active layer 130. For example, the light blocking layer 150 is formed of any material having a light blocking function. For example, the light blocking layer 150 is formed of an insulating material having a light blocking function, such as a black resin. For example, the light blocking layer is formed of a conductive material (for example, a metal) or a semiconductor material having a light blocking function.

For example, in at least one embodiment of the present disclosure, the light blocking layer 150 and the active layer 140 are made of a same material and are in a same layer; or the light blocking layer 150 and the source/drain electrode layer 140 are made of a same material and are in a same layer. In this way, the active layer 130 and the light blocking layer 150 are simultaneously formed by a same patterning process or the source/drain electrode layer 140 and the light blocking layer 150 are simultaneously formed by a same patterning process. In this way, providing the light blocking layer 150 in the thin film transistor does not increase the preparation process steps of the thin film transistor, which saves costs.

For example, in at least one embodiment of the present disclosure, the light blocking layer 150 and the active layer 130 are in the same layer and are made of the same material. In this case, the light blocking layer 150 made of the same material as the active layer 130 may generate photo-induced carriers under the irradiation of light, so it is necessary to space the light-blocking layer 150 from the active layer 130 to prevent the photo-induced carriers generated in the light-blocking layer 150 from moving into the active layer 130. For example, a thickness of the light blocking layer 150 and a thickness of the active layer 130 are the same, in this way, the light blocking layer 150 and the active layer 130 are easily formed simultaneously by one patterning process.

For example, in at least one embodiment of the present disclosure, the light blocking layer 150 and the active layer 130 are in the same layer and are made of the same material, and the thickness of the light blocking layer 150 is greater than the thickness of the active layer 130, so as not only to prevent the light parallel to the base substrate from irradiating the lateral surface of the active layer 130 but also to prevent the light incident in an oblique direction with respect to the base substrate 100 from irradiating the lateral surface of the active layer 130, to further increase the shielding effect of the light blocking layer 150 on the active layer 130. For example, a dual tone mask (for example, a halftone mask or a gray tone mask) is used to pattern a semiconductor film for forming the active layer 130, so as to form the light blocking layer 150 and the active layer 130 at the same time and the thickness of the light blocking layer 150 is greater than the thickness of the active layer 130. For example, the semiconductor film is formed on the base substrate 100; a photoresist is coated on the semiconductor thin, the dual tone mask is used to expose the photoresist, and then the exposed photoresist is developed to obtain a photoresist full retention portion, a photoresist partial retention portion and a photoresist full removal portion, the photoresist full retention portion is a region where the light blocking layer 150 is to be formed, the photoresist partial retention portion is a region where the active layer 130 is to be formed and the photoresist full removal portion is the rest region; a first etching is performed to remove a portion, in the photoresist full removal portion, of the semiconductor film; an ashing process is performed to remove a portion, in the photoresist partial retention portion, of the photoresist and to thin a portion, in the photoresist full retention portion, of the photoresist; a second etching is performed to partially remove a portion, in the photoresist partial retention portion, of the semiconductor film to obtain the active layer 130; and the portion, in the photoresist full retention portion, of the photoresist is removed to obtain the light blocking layer 150.

For example, in at least one embodiment of the present disclosure, the light blocking layer 150 and the source/drain electrode layer 140 are in the same layer and are made of the same material. For example, the source/drain electrode layer 140 and the light blocking layer 150 are formed of metal. For example, the thickness of the light blocking layer 150 and the thickness of the active layer 130 are the same. For example, the thickness of the light blocking layer 150 is greater than the thickness of the active layer 130, so as not only to prevent the light parallel to the base substrate 100 from irradiating the lateral surface of the active layer 130 but also to prevent the light incident in the oblique direction with respect to the base substrate 100 from irradiating the lateral surface of the active layer 130, to further increase the shielding effect of the light blocking layer 150 on the active layer 130. In the case where the light blocking layer 150 and the source/drain electrode layer 140 are in the same layer and are made of the same material, because the light blocking layer 150 and the active layer 130 are separately prepared, a single tone mask is used to obtain the light blocking layer 150 having the thickness greater than the thickness of the active layer 130, without the need of using the dual tone mask, so that the manufacturing process is further simplified.

For example, in at least one embodiment of the present disclosure, the light blocking layer 150 is spaced apart from at least one of the source electrode 141 and the drain electrode 142 in the case where the light blocking layer 150 is disposed in the same layer and is made of the same material as the source/drain electrode layer 140. For example, in the case where the light blocking layer 150 is disposed in the same layer and is made of the same material as the source/drain electrode layer 140, the light blocking layer 150 is not connected with both the source electrode 141 and the drain electrode 142 to prevent the light blocking layer from connecting together the source electrode and the drain electrode. For example, in the thin film transistor provided in at least one embodiment of the present disclosure, the light blocking layer 150 is spaced apart from one of the source electrode 141 and the drain electrode 142 included in the source/drain electrode layer 140 and is connected with the other one of the source electrode 141 and the drain electrode 142; in this case, the light blocking layer 150 is connected with one of the source electrode 141 and the drain electrode 142, so the light blocking layer 150 is, for example, formed integrally with the one of the source electrode 141 and the drain electrode 142 to further simplify the manufacturing process, and the light blocking layer 150 cooperates with the one of the source electrode 141 and the drain electrode 142 connected with the light blocking layer 150 to better prevent the light from being irradiated onto the active layer 130. For example, as shown in FIG. 2a, the light blocking layer 150 is connected with or integrally formed with the source electrode 141 and is disconnected from the drain electrode 142; and in this case, there is no gap between the light blocking layer 150 and the source electrode 141, which facilitates preventing the light from irradiating the lateral surface of the active layer 130. As shown in FIG. 2a, the light blocking layer 150 is disconnected from the drain electrode 142 such that there is a gap 170 between the light blocking layer 150 and the drain electrode 142, and light may be incident on the active layer 130 through the gap 170; therefore, it is necessary to make the width of the gap 170 as small as possible. For example, the gap 170 has a width of several micrometers.

Figure 2B:
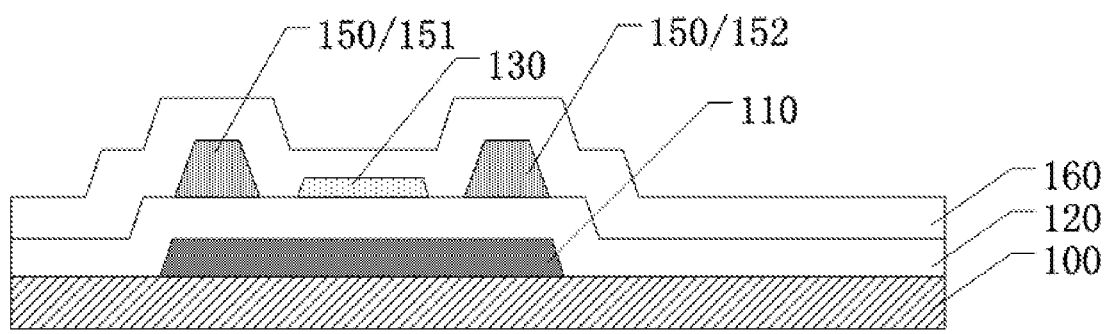
FIG. 2b is a schematic cross-sectional view of the thin film transistor shown in FIG. 2a along a C-D direction.

FIG. 2b is a cross-sectional view of the thin film transistor shown in FIG. 2a along the C-D direction. As shown in FIG. 2b, the thin film transistor includes the base substrate 100, and the gate electrode 110, the gate insulating layer 120, the active layer 130, the source/drain electrode layer (not shown in FIG. 2b), the light blocking layer 150 and a passivation layer 160 which are disposed on the base substrate 100 in sequence.

Figure 2C:
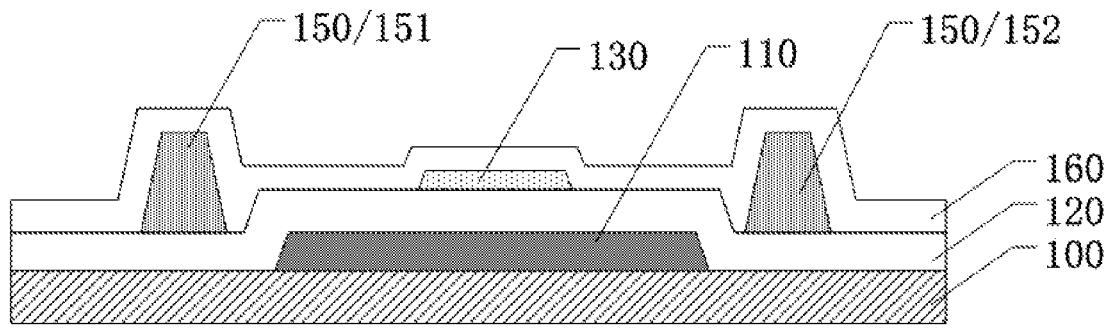
FIG. 2c is another schematic cross-sectional view of the thin film transistor shown in FIG. 2a along the C-D direction.

FIG. 2c is another cross-sectional view of the thin film transistor shown in FIG. 2a along the C-D direction. For example, in at least one embodiment of the present disclosure, as shown in FIG. 2b and FIG. 2c, a distance from a surface, away from the base substrate 100, of the light blocking layer 150 to the base substrate 100 is greater than or equal to a distance from a surface, away from the base substrate 100, of the active layer 130 to the base substrate 100; and/or a distance from a surface, close to the base substrate 100, of the light blocking layer 150 to the base substrate 100 is smaller than or equal to a distance from a surface, close to the base substrate 100, of the active layer 130 to the base substrate 130. In this way, it is more effective to prevent the light from irradiating the active layer 130.

For example, in at least one embodiment of the present disclosure, as shown in FIG. 2b, the light blocking layer 150 is disposed to overlap with the gate electrode 110. For example, an orthographic projection of the light blocking layer 150 on the base substrate 100 is within an orthographic projection of the gate electrode 110 on base substrate 100. As such. a height of the light blocking layer 150 (a distance from an end portion, away from the base substrate 100, of the light blocking layer 150 to the base substrate 100) is increased, the irradiation of the active layer 130 with the light incident in the oblique direction from a position above the light blocking layer 150 is prevented.

For example, in at least one embodiment of the present disclosure, as shown in FIG. 2c, the light blocking layer 150 is disposed not to overlap with the gate electrode 110. For example, the orthographic projection of the light blocking layer 150 on the base substrate 100 is outside of the orthographic projection of the gate electrode 110 on the base substrate 100. In this way, a distance from an end portion, close to the base substrate 100, of the light blocking layer 150 to the base substrate is reduced, and thus the irradiation of the active layer 130 by the light incident in the oblique direction from a position below the light blocking layer 150 is further prevented.

For example, in at least one embodiment of the present disclosure, a shape of a pattern of the light blocking layer 150 is of various types. Exemplarily, for example, a shape of a cross-section of the light blocking layer 150 parallel to the base substrate 100 includes at least one selected from the group consisting of a strip shape, an L-shape, an arc shape or the like. The embodiments of the present disclosure do not limit the shape of the pattern of the light blocking layer 150 as long as the light blocking layer 150 shields the lateral surface of the active layer 130 without affecting the performance of the thin film transistor.

Figure 3A:
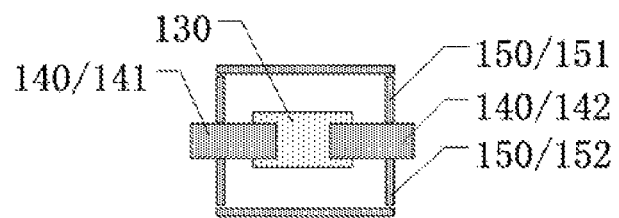
FIG. 3(a) to FIG. 3(c) are schematic views of a light blocking layer in the thin film transistor provided by the embodiments of the present disclosure.
Figure 3B:
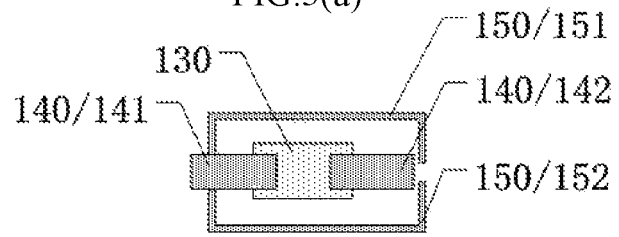
Figure 3C:
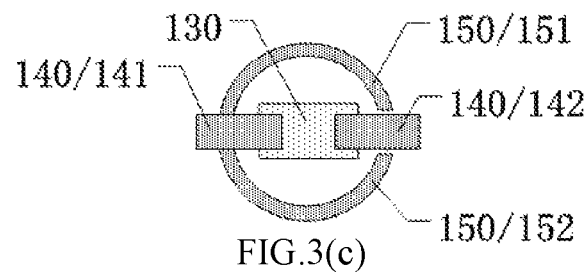

FIG. 3(a) to FIG. 3(c) are schematic views of the light blocking layer in the thin film transistor provided by the embodiments of the present disclosure. For example, as shown in FIG. 3(a) to FIG. 3(c), the cross-sectional shape of the light blocking layer 150 includes the strip shape, the L-shape and the arc shape, respectively. It should be noted that, the cross-sectional shape of the light blocking layer 150 may be a combination of the above-mentioned multiple types of shapes. For example, taking the light blocking layer 150 in the thin film transistor in FIG. 3(a) as an example, a first subsection 151 of the light blocking layer 150 is in the strip shape, and the strip shape of a second subsection 152 of the light blocking layer 150 may be replaced with the L-shape shown in FIG. 3(b) or the arc shape shown in FIG. 3(c).

For example, in at least one embodiment of the present disclosure, the light blocking layer 150 is a closed pattern, such as a "☐" pattern or the like, formed by subsections which are connected end-to-end. For example, in at least one embodiment of the present disclosure, the light blocking layer 150 includes a plurality of subsections spaced apart from each other, and the light blocking layer 150 including the plurality of subsections shields the active layer 130 in a direction parallel to the base substrate. For example, the plurality of subsections are disposed so that the active layer is shielded by the light blocking layer 150 in all directions parallel to the base substrate.

For example, in at least one embodiment of the present disclosure, as shown in FIG. 3(a), the plurality of subsections of the light blocking layer 150 have no overlapping portions in the direction parallel to the base substrate 100. As such, the area occupied by the light blocking layer 150 is reduced.

Figure 4:
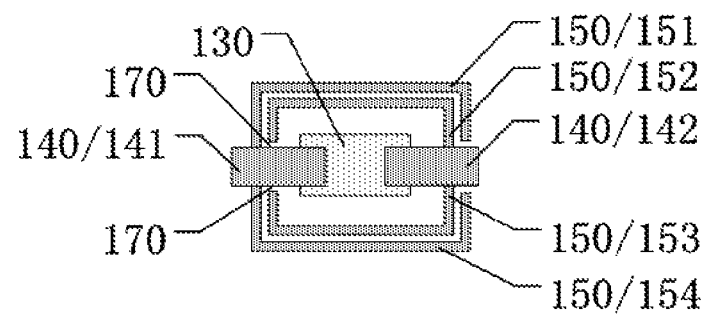
FIG. 4 is another schematic view of the light blocking layer in the thin film transistor provided by at least one of the embodiments of the present disclosure; FIG.

For example, in at least one embodiment of the present disclosure, the plurality of subsections of the light blocking layer 150 have an overlapping portion in the direction parallel to the base substrate 100 so that the active layer 130 is shielded by the light blocking layer 150 in all directions parallel to the base substrate 100. FIG. 4 is another schematic view of the light blocking layer of the thin film transistor provided by at least one embodiment of the present disclosure. Exemplarily, as shown in FIG. 4, the light blocking layer 150 includes a first subsection 151 and a second subsection 152 which are sequentially disposed on a first side of the active layer 130 and which overlap each other in the direction parallel to the base substrate 100. The light blocking layer 150 includes, on a second side of the active layer 130, a third subsection 153 and a fourth subsection 154 which overlap each other in the direction parallel to the base substrate 100, and the first subsection 151, the second subsection 152, the third subsection 153 and the fourth subsection 154 cooperate with each other so that the active layer 130 is shielded by the light blocking layer 150 in all directions parallel to the base substrate 100, to prevent light from being irradiated onto the active layer 130 more effectively. In particular, the light is prevented from being irradiated onto the lateral surface of the active layer 130 more effectively. For example, as shown in FIG. 4, the first subsection 151 of the light blocking layer 150 is connected with the source electrode 141 and disconnected from the drain electrode 142, the second subsection 152 of the light blocking layer 150 is disconnected from the source electrode 141 and is connected with the drain electrode 142, and the first subsection 151 and the second subsection 152 overlap each other in the direction parallel to the base substrate 100; and in this case, the first subsection 151 shields a gap between the second subsection 152 and the source electrode 141, and the second subsection 152 shields a gap between the first subsection 151 and the drain electrode 142, such that the light blocking layer 150 completely prevents the light from irradiating the lateral surface of the active layer 130.

The embodiments of the present disclosure further provide an array substrate, which includes the thin film transistor in any one of the above embodiments.

For example, in at least one embodiment of the present disclosure, the array substrate further includes a plurality of gate lines and a plurality of data lines, the plurality of gate lines and the plurality of data lines cross each other to define a plurality of sub-pixel regions, each of the sub-pixel regions includes the thin film transistor and a pixel electrode, the gate electrode of the thin film transistor is electrically connected with the gate line corresponding to the thin film transistor, the source electrode of the thin film transistor is electrically connected with the data line corresponding to the thin film transistor, and the drain electrode of the thin film transistor is electrically connected with the pixel electrode; and each of the sub-pixel regions includes a display region and a non-display region, and the light blocking layer is in the non-display region of each of the sub-pixel regions. It should be noted that the gate line, the data line and the thin film transistor are all in the non-display region of the sub-pixel regions, and the pixel electrode is in the display region of the sub-pixel region.

In the following, the technical solutions in the following embodiments of the present disclosure will be described with one sub-pixel region as an example.

Figure 5:
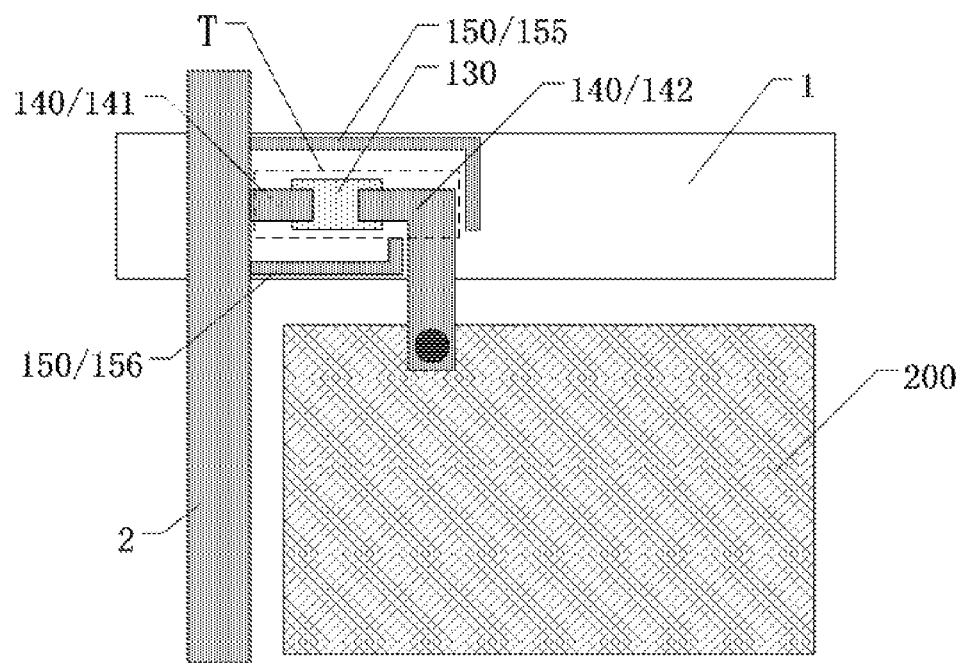
FIG. 5 is a top view of a sub-pixel region in an array substrate provided by at least one of the embodiments of the present disclosure.

FIG. 5 is a schematic structural view of one sub-pixel region in the array substrate provided by the embodiments of the present disclosure, which is a partial schematic view of one sub-pixel region. For example, in at least one embodiment of the present disclosure, as shown in FIG. 5, the sub-pixel region of the array substrate includes the gate line 1 and the data line 2, the pixel electrode 200 and the thin film transistor (including the active layer 130 and the source/drain electrode layer 140) and the light blocking layer 150. The source/drain electrode layer 140 includes the source electrode 141 and the drain electrode 142. The source electrode 141 is electrically connected with the data line 2, the gate electrode (not shown in FIG. 5) of the thin film transistor is electrically connected with the gate line 1, the drain electrode 142 is electrically connected with the pixel electrode 200, and the thin film transistor serves as a switching element to control the switching of the pixel electrode 200.

For example, in at least one embodiment of the present disclosure, each sub-pixel region of the array substrate includes the display region and the non-display region, the pixel electrode 200 is disposed in the display region, and the thin film transistor and the light blocking layer 150 are disposed in the non-display region.

For example, in at least one embodiment of the present disclosure, similar to the above embodiments related to the thin film transistor, the light blocking layer 150 surrounds the active layer 130. For example, the light blocking layer 150 is disposed to shield only the lateral surface of the active layer 130 in the direction parallel to the base substrate 100 without shielding a lateral surface of the source electrode 141, a lateral surface of the drain electrode 142 and/or a lateral surface of the gate electrode 110, in other words, the light blocking layer 150 surrounds only the active layer 130, and does not surround the source electrode 141, the drain electrode 142 and the gate electrode 110. For example, the light blocking layer 150 surrounds the thin film transistor; in this case, the light blocking layer 150 is disposed to shield the lateral surface of the active layer 130, the lateral surface of the source electrode 141, the lateral surface of the drain electrode 142 and the lateral surface of the gate electrode in the direction parallel to the base substrate 100, in other words, the light blocking layer 150 is disposed to surround the active layer 130, the source electrode 141, the drain electrode 142 and the gate electrode 110. For example, as shown in FIG. 5, the dashed region T indicates a region where the thin film transistor is located, and the light blocking layer 150 surrounds the region T to shield a lateral surface of the thin film transistor. For examples, a fifth subsection 155 and a sixth subsection 156 of the light blocking layer 150 shown in FIG. 5 surrounds the thin film transistor to shield the lateral surface of the thin film transistor, so that the lateral surface of the active layer 130 in the thin film transistor is shielded to avoid being exposed to light.

For example, in the array substrate provided by at least one embodiment of the present disclosure, the pattern type of the light-blocking layer 150 surrounding the thin film transistor may refer to the pattern type of the light-blocking layer in the foregoing embodiments (the embodiments related to the thin film transistor provided by the present disclosure). Detailed descriptions are omitted herein.

For example, in the array substrate provided by at least one embodiment of the present disclosure, a first end of the light blocking layer 150 is connected with a data line, and a second end is spaced apart from the drain electrode. Exemplarily, as shown in FIG. 5, the fifth subsection 155 of the light blocking layer 150 is taken as an example for illustration, a first end of the fifth subsection 155 is connected with the data line 2, and a second end of the fifth subsection 155 is spaced apart from the drain electrode 142 of the thin film transistor, so that the light blocking effect of the light blocking layer 150 is improved (no gap is between the first end of the fifth subsection 155 connected with the data line 2 and the data line 2), and a connection between the drain electrode 142 and the data line 2 is avoided as well.

At least one embodiment of the present disclosure provides a display panel, which includes the array substrate provided by any one of the above embodiments. For example, the display panel provided by at least one embodiment of the present disclosure further includes an opposite substrate opposite to the array substrate.

For example, in at least one embodiment of the present disclosure, the display panel is a liquid crystal display panel, for example, the array substrate and the opposite substrate of the liquid crystal display panel are opposed to each other to form a liquid crystal cell, and the liquid crystal cell is filled with a liquid crystal material. The opposite substrate is, for example, a color filter substrate. An electric field formed between the pixel electrode of the array substrate and a common electrode controls a degree of rotation of the liquid crystal material to perform image display. For example, the common electrode is disposed at the array substrate or the opposite substrate.

For example, in at least one embodiment of the present disclosure, the display panel is an organic light-emitting diode (OLED) display panel, in which, an organic light-emitting material is formed in each of the sub-pixel regions of the display panel, and the pixel electrode is used as an anode or a cathode for driving the organic light-emitting material to emit light for image display.

For example, in at least one embodiment of the present disclosure, the display device is an electronic paper display panel, in which an electronic ink layer is formed on the array substrate of the display panel, and the pixel electrode is used to apply a voltage for driving charged microparticles in the electronic ink to move so as to realize image display.

In the embodiments provided by the present disclosure, an upper side (a side away from the substrate substrate) of the active layer 130 of the thin film transistor may still be affected by the light. For example, in the display panel provided by at least one embodiment of the present disclosure, a spacer is disposed between the opposite substrate and the array substrate, the spacer and the thin film transistor on the array substrate are opposite to each other in a direction perpendicular to the array substrate, and the spacer includes a light blocking material. For example, the spacer is disposed to cover the entire region where the thin film transistor is located, or is disposed to cover at least the active layer 130 in the thin film transistor, such that the spacer blocks light irradiated from the upper side of the active layer 130 of the thin film transistor.

Figure 6:
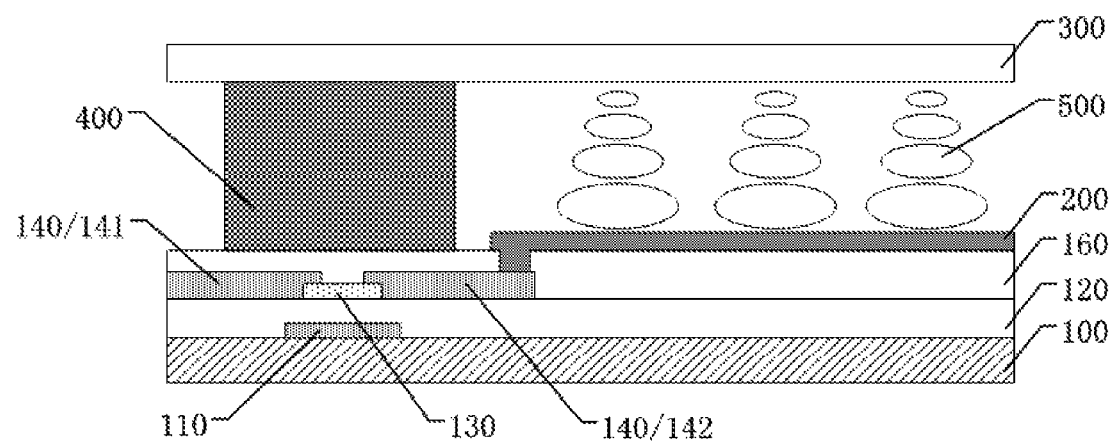
FIG. 6 is a schematic cross-sectional view of a display panel according to at least one of the embodiments of the present disclosure.

FIG. 6 is a schematic cross-sectional view of the display panel provided by the embodiments of the present disclosure. The display panel is, for example, the liquid crystal display panel. For example, as shown in FIG. 6, a liquid crystal layer 500 is disposed between the array substrate and the opposite substrate 300 which are opposite to each other, to form a liquid crystal cell, the spacer 400 is disposed between the array substrate and the opposite substrate 300, and the spacer 400 overlaps the thin film transistor and includes a light blocking material, so that the spacer 400 prevents the light from irradiating the active layer 130 from the upper side of the active layer 130 of the thin film transistor.

In the embodiments of the present disclosure, no limitation is imposed on the material for forming the spacer. For example, in the display panel provided by at least one embodiment of the present disclosure, the spacer includes a light blocking material which, for example, is a material that can block light such as carbon black and/or a black resin.

For example, in at least one embodiment of the present disclosure, as shown in FIG. 6, a common electrode is disposed at the opposite substrate 300, and an electric field that drives rotation of liquid crystal molecules in the liquid crystal layer 500 is formed between the common electrode and the pixel electrode 200.

At least one embodiment of the present disclosure provides a manufacturing method for a thin film transistor. The method includes: providing a base substrate; forming a gate electrode, a gate insulating layer, an active layer and a source/drain electrode layer on the base substrate, the source/drain electrode layer including a source electrode and a drain electrode; and forming a light blocking layer surrounding the active layer.

Figure 7:
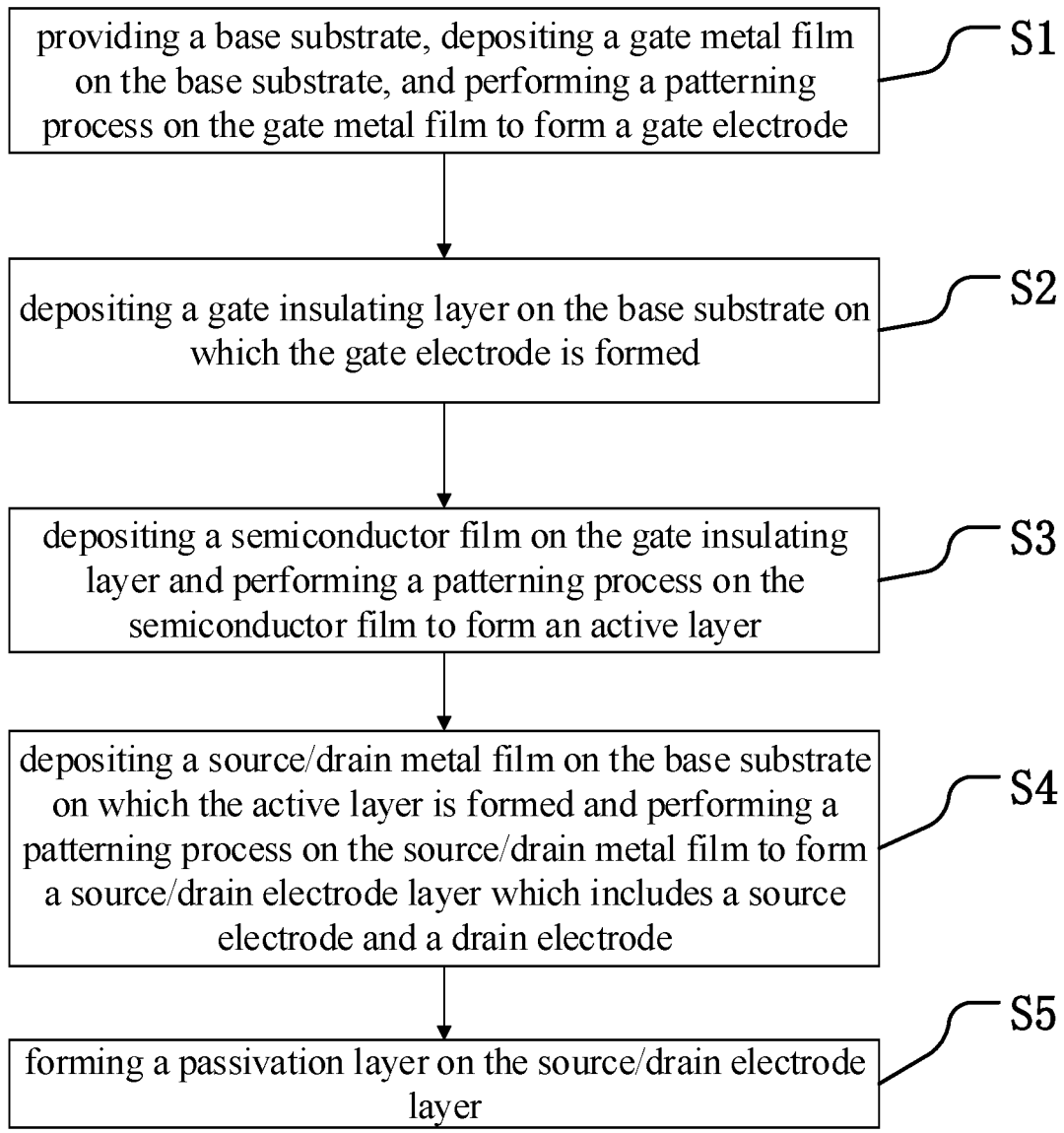
FIG. 7 is a flow chart of a manufacturing method for the thin film transistor provided by at least one of the embodiments of the present disclosure.

To facilitate understanding of the technical solutions in the embodiments of the present disclosure, the embodiments provide the manufacturing process of the thin film transistor of bottom gate as an example. FIG. 7 is a flow chart of the manufacturing method for the thin film transistor provided by the embodiments of the present disclosure. For example, in one example of the embodiments of the present disclosure, as shown in FIG. 7, the manufacturing method for the thin film transistor includes the following process.

S1: providing a base substrate, depositing a gate metal film on the base substrate, and performing a patterning process on the gate metal film to form a gate electrode.

For example, the base substrate is a glass substrate or the like.

For example, a material of the gate electrode is a copper-based metal, for example, copper (Cu), copper-molybdenum alloy (Cu/Mo), copper-titanium alloy (Cu/Ti), copper-molybdenum-titanium alloy (Cu/Mo/Ti), copper-molybdenum-tungsten alloy (Cu/Mo/W), copper-molybdenum-niobium alloy (Cu/Mo/Nb) or the like; or, the material of the gate electrode is a chromium-based metal, for example, chromium-molybdenum alloy (Cr/Mo), chromium-titanium alloy (Cr/Ti), chromium-molybdenum-titanium alloy (Cr/Mo/Ti) or the like; or, the material of the gate electrode may also be aluminum or aluminum alloy.

In the embodiments of the present disclosure, the patterning process is, for example, a photolithographic patterning process, which for example, includes: coating a photoresist layer on a structure layer that needs to be patterned, exposing the photoresist layer using a mask plate, developing the exposed photoresist layer to obtain a photoresist pattern, etching the structure layer by using the photoresist pattern as a mask, and then removing the photoresist pattern optionally.

S2: depositing a gate insulating layer on the base substrate on which the gate electrode is formed.

For example, a material of the gate insulating layer includes silicon nitride (SiNx), silicon oxide (SiOx), aluminum oxide ($Al_2O_3$), aluminum nitride (AlN), or other suitable materials.

S3: depositing a semiconductor film on the gate insulating layer and performing a patterning process on the semiconductor film to form an active layer.

For example, in the manufacturing method provided in this example, the light blocking layer and the active layer are formed in the same layer and made of the same material. For example, after depositing the semiconductor film on the base substrate, a patterning process is performed on the semiconductor film to simultaneously form the active layer and the light blocking layer. For example, the light blocking layer is formed around the active layer to prevent the lateral surface of the active layer from being irradiated by light.

For example, a material of the active layer includes amorphous silicon, polysilicon, or indium gallium zinc oxide (IGZO), indium zinc oxide (IZO), zinc oxide (ZnO), gallium zinc oxide (GZO) or other metal oxides.

S4: depositing a source/drain metal film on the base substrate on which the active layer is formed and performing a patterning process on the source/drain metal film to form a source/drain electrode layer which includes a source electrode and a drain electrode.

For example, in the manufacturing method provided in this example, the light blocking layer and the source/drain electrode layer are formed in the same layer and made of the same material. Exemplarily, for example, after the source/drain metal film is deposited on the base substrate, the patterning process is performed on the source/drain metal film to simultaneously form the source/drain electrode layer and the light blocking layer. For example, the light blocking layer is formed around the active layer to prevent the lateral surface of the active layer from being irradiated by light.

For example, in the present example, the source/drain electrode layer includes a metal material; and a single-layer or multi-layer structure may be formed, for example, a single-layer of aluminum, a single-layer of molybdenum, or a structure that an aluminum layer is sandwiched between two molybdenum layers.

It should be noted that, in the present example, the formation of the light blocking layer is not limited to the manufacturing method provided in the above example, and the light blocking layer may also be formed individually. For example, the light blocking layer is individually formed by, for example, depositing a thin film and performing a patterning process on the thin film, and is formed around the active layer so as to prevent the lateral surface of the active layer from being irradiated by light; and the formed pattern type of the light blocking layer may refer to the foregoing embodiments, and detailed descriptions are omitted herein.

S5: forming a passivation layer on the source/drain electrode layer.

For example, in the present example, a material of the passivation layer is silicon nitride (SiNx), silicon oxide (SiOx), acrylic resin, or the like.

The embodiments of the present disclosure provide the thin film transistor and the manufacturing method for the thin film transistor, the array substrate and the display panel, and have at least one of the following advantageous effects.

(1) The light blocking layer prevents the lateral surface of the active layer from being irradiated by light, and thus reduces or eliminates defects such as poor display caused by photo-induced carriers generated due to that the active layer is irradiated by light.

(2) The spacer includes the light blocking material and overlaps with the thin film transistor, so as to shield the active layer on an upper side of the active layer.

(3) The light blocking layer is formed simultaneously during the manufacturing of the active layer or the source/drain electrode layer of the thin film transistor without adding manufacturing steps.

For this disclosure, the following points need to be explained.

(1) The drawings of the embodiments of the present disclosure relate only to the structures involved in the embodiments of the present disclosure, and other structures may refer to normal designs.

(2) For the sake of clarity, in the drawings used to describe the embodiments of the present disclosure, thicknesses of layers or regions are enlarged or reduced, that is, these drawings are not drawn in actual scale.

(3) In the case of no conflict, the embodiments of the present disclosure and the features in the embodiments can be combined with each other to obtain a new embodiment.

What are described above is related to the illustrative embodiments of the disclosure only and not limitative to the scope of the disclosure; the scopes of the disclosure are defined by the accompanying claims.

What is claimed is:

1. A thin film transistor, comprising:
   a base substrate; and
   a gate electrode, a gate insulating layer, an active layer and a source/drain electrode layer which are on the base substrate, wherein the source/drain electrode layer comprises a source electrode and a drain electrode,
   wherein the thin film transistor further comprises a light blocking layer surrounding the active layer;
   a whole of the light blocking layer is physically connected and in direct contact with one of the source electrode and the drain electrode, and the whole of the light blocking layer is spaced apart from the other one of the source electrode and the drain electrode.

2. The thin film transistor according to claim 1, wherein the light blocking layer and the source/drain electrode layer are in a same layer and comprise a same material.

3. The thin film transistor according to claim 1, wherein the light blocking layer comprises an insulating material.

4. The thin film transistor according to claim 1, wherein
   a distance from a surface, away from the base substrate, of the light blocking layer to the base substrate is greater than or equal to a distance from a surface, away from the base substrate, of the active layer to the base substrate; or
   a distance from a surface, close to the base substrate, of the light blocking layer to the base substrate is smaller than or equal to a distance from a surface, close to the base substrate, of the active layer to the base substrate; or
   the distance from the surface, away from the base substrate, of the light blocking layer to the base substrate is greater than or equal to the distance from the surface, away from the base substrate, of the active layer to the base substrate, and the distance from the surface, close to the base substrate, of the light blocking layer to the base substrate is smaller than or equal to the distance from the surface, close to the base substrate, of the active layer to the base substrate.

5. The thin film transistor according to claim 1, wherein an orthographic projection of the light blocking layer on the base substrate is within an orthographic projection of the gate electrode on the base substrate.

6. The thin film transistor according to claim 1, wherein an orthographic projection of the light blocking layer on the base substrate is outside of an orthographic projection of the gate electrode on the base substrate.

7. The thin film transistor according to claim 1, wherein the light blocking layer includes a plurality of subsections which are spaced apart from each other and are configured that the active layer is shielded by the light blocking layer in a direction parallel to the base substrate.

8. An array substrate, comprising the thin film transistor according to claim 1.

9. The array substrate according to claim 8, further comprising a plurality of gate lines and a plurality of data lines, wherein
the plurality of gate lines and the plurality of data lines cross each other to define a plurality of sub-pixel regions, each of the sub-pixel regions comprises the thin film transistor and a pixel electrode, the gate electrode of the thin film transistor is electrically connected with the gate line corresponding to the thin film transistor, the source electrode of the thin film transistor is electrically connected with the data line corresponding to the thin film transistor, and the drain electrode of the thin film transistor is electrically connected with the pixel electrode; and
each of the sub-pixel regions comprises a display region and a non-display region, and the light blocking layer is in the non-display region of each of the sub-pixel regions.

10. The array substrate according to claim 9, wherein a first end of the light blocking layer is connected with the data line, and a second end of the light blocking layer is spaced apart from the drain electrode.

11. The array substrate according to claim 8, wherein the light blocking layer surrounds the thin film transistor.

12. A display panel, comprising the array substrate according to claim 8 and an opposite substrate which is opposite to the array substrate.

13. The display panel according to claim 12, wherein a spacer is between the opposite substrate and the array substrate, the spacer is opposite to the thin film transistor on the array substrate in a direction perpendicular to the array substrate, and the spacer comprises a light blocking material.

14. The display panel according to claim 13, wherein the light blocking material comprises carbon black or a black resin, or comprises carbon black and a black resin.

15. A manufacturing method of a thin film transistor, comprising:
providing a base substrate; and
forming a gate electrode, a gate insulating layer, an active layer and a source/drain electrode layer on the base substrate, wherein the source/drain electrode layer comprises a source electrode and a drain electrode,
wherein the method further comprises forming a light blocking layer surrounding the active layer;
and a whole of the light blocking layer is physically connected and in direct contact with one of the source electrode and the drain electrode, and the whole of the light blocking layer is spaced apart from the other one of the source electrode and the drain electrode.

* * * * *